(12) United States Patent
Mori et al.

(10) Patent No.: US 11,706,723 B2
(45) Date of Patent: Jul. 18, 2023

(54) RADIO FREQUENCY GENERATOR WITH AUTOMATIC LEVEL CONTROL

(71) Applicant: XP Power Limited, Singapore (SG)

(72) Inventors: Eiji Mori, San Jose, CA (US); Yibing Ma, Tracy, CA (US); Shaohua Jia, Chatham, NJ (US)

(73) Assignee: XP Power Limited, Singapore (SG)

( * ) Notice: Subject to any disclaimer, the term of this patent is extended or adjusted under 35 U.S.C. 154(b) by 0 days.

(21) Appl. No.: 17/343,548

(22) Filed: Jun. 9, 2021

(65) Prior Publication Data

US 2022/0400449 A1    Dec. 15, 2022

(51) Int. Cl.
*H04W 52/52*    (2009.01)
*H04B 1/00*    (2006.01)

(52) U.S. Cl.
CPC .......... *H04W 52/52* (2013.01); *H04B 1/0007* (2013.01)

(58) Field of Classification Search
CPC .. H03F 3/245; H03F 2200/336; H03F 1/0227; H03F 1/0277; H03F 3/195; H03F 3/211; H03F 1/0261; H03F 2200/451; H03F 2200/537; H03F 3/72; H03F 2200/171; H03F 2200/222; H03F 2200/27; H03F 2200/318; H03F 2200/387; H03F 2200/411; H03F 2200/414; H02M 3/156; H02M 1/008; H02M 3/07; H02M 3/157; H02M 1/0012; H02M 1/007; H02M 1/0845; H02M 3/1584; H02M 3/1588; H02M 3/33515; H02M 3/33576; H02M 1/0009; H02M 1/34; H02M 3/00; H04B 2001/0416; H04B 1/0003; H04B 1/0007; H04B 1/28; H04B 1/00; H04B 1/40; H04B 1/406;
(Continued)

(56) References Cited

U.S. PATENT DOCUMENTS 5,054,116 A    10/1991  Davidson
8,019,295 B2    9/2011  Fan
(Continued)

FOREIGN PATENT DOCUMENTS

TW    201001947 A1    1/2010
TW    I533645 B    5/2016

OTHER PUBLICATIONS

PCT Application No. PCT/US2022/025150, International Search Report and Written Opinion, dated Sep. 13, 2022, 12 pages.
(Continued)

*Primary Examiner* — Golam Sorowar

(57) ABSTRACT

A radio frequency (RF) generator incorporates an automatic level control (ALC) circuit to control the output level of the RF signal where the ALC circuit implements synchronized ADC sampling, pulse sample indexing, gated accumulation to enable fast ALC loop control, especially for pulse-modulated RF signals. In other embodiments, the ALC circuit implements multi-level control for multi-level RF signals. In this manner, the RF generator uses the ALC circuit to generate an RF signal having a constant power level for RF signals having any pulse shape or output levels. In other embodiments, a clock generation circuit in an impedance matching network synchronizes a slave clock to a clock signal of the RF signal when the load impedance is resistive only or when the clock signal of the RF signal has a given phase condition.

20 Claims, 13 Drawing Sheets

(58) Field of Classification Search
CPC .. H04B 15/005; H04B 17/104; H04B 17/345; H04B 1/0458; H04B 17/0085; H04B 17/11; H04B 2203/542; H04B 2203/5425; H04B 2203/5445; H04B 2203/5458; H04B 2203/5483; H04L 1/0001; H04L 1/0054; H04L 1/006; H04L 1/18; H04L 2027/003; H04L 2027/0065; H04L 25/497; H04L 27/0008; H04L 27/183; H04L 27/3416; H04L 25/03828; H04L 25/06; H04L 27/367; H03M 13/256; H03M 13/3961; H03M 13/41; H03M 13/4123; H03M 13/6325; H03M 13/6502; H03M 13/6508; H03M 13/6569; H03M 1/363; H03M 5/08

See application file for complete search history.

(56) References Cited

U.S. PATENT DOCUMENTS

| | | | |
|---|---|---|---|
| 9,118,523 B2 | 8/2015 | Su et al. | |
| 9,136,093 B2 | 9/2015 | Coumou et al. | |
| 9,190,974 B2 | 11/2015 | Richt et al. | |
| 9,696,403 B1 | 7/2017 | Elder-Groebe et al. | |
| 9,900,197 B1* | 2/2018 | Rada | H04L 27/2334 |
| 10,386,444 B1 | 8/2019 | Stickle | |
| 10,491,202 B2 | 11/2019 | Oshida et al. | |
| 10,665,427 B2 | 5/2020 | Kapoor et al. | |
| 2005/0003785 A1 | 1/2005 | Jackson et al. | |
| 2005/0069059 A1* | 3/2005 | Krivokapic | H04B 1/7183 375/340 |
| 2008/0056419 A1* | 3/2008 | Lee | H04L 7/048 375/355 |
| 2009/0315463 A1* | 12/2009 | Coumou | H01J 37/32082 315/111.21 |
| 2015/0262704 A1 | 9/2015 | Drewery | |
| 2016/0044775 A1 | 2/2016 | Valcore et al. | |

OTHER PUBLICATIONS

Office Action and search report cited in corresponding Taiwan Patent Application No. 111116994, dated Feb. 16, 2023, 9 pages.

* cited by examiner ies in plasma semiconductor equipment for generating plasma for manufacturing silicon wafers. A typical plasma tool may include an RF generator, an impedance matching system and a plasma chamber. In semiconductor applications, the RF generator may generate a continuous wave (CW) signal, a pulse-modulated signal, a ramp signal or a multi-level RF signal. A pulse-modulated RF generator applies the RF signal by pulsing the RF signal to the load.

RADIO FREQUENCY GENERATOR WITH AUTOMATIC LEVEL CONTROL

FIELD OF THE INVENTION

The invention relates to a radio frequency (RF) generator and, in particular, to an automatic level control circuit in an RF generator.

BACKGROUND OF THE INVENTION

An RF generator or RF power supply is an industrial equipment used for supplying RF energy to a load device. RF generators are commonly used in the semiconductor industry, such as in plasma semiconductor equipment for generating plasma for manufacturing silicon wafers. A typical plasma tool may include an RF generator, an impedance matching system and a plasma chamber. In semiconductor applications, the RF generator may generate a continuous wave (CW) signal, a pulse-modulated signal, a ramp signal or a multi-level RF signal. A pulse-modulated RF generator applies the RF signal by pulsing the RF signal to the load.

An RF generator generates an RF signal with a desired amplitude and output frequency. RF generators typically implement some form of amplitude level control. In particular, the output level of the RF generator can vary due to temperature variations of the components of the generator, drifts or variations of the power supply or other reasons. The RF generator implements an amplitude level control loop to hold the RF output power at the desired level based on feedback signals. For example, the RF output is sampled and compared to a reference level to set the desired output power level. The difference between the sampled RF output and the reference level constitutes an error signal. The operation of the feedback loop is to control the output level of the RF signal in response to the error signal to realize a stable output level.

BRIEF DESCRIPTION OF THE DRAWINGS

Various embodiments of the invention are disclosed in the following detailed description and the accompanying drawings.

DETAILED DESCRIPTION

According to embodiments of the present disclosure, a radio frequency (RF) generator incorporates an automatic level control (ALC) circuit to control the output level of the RF signal where the ALC circuit implements synchronized ADC sampling, pulse sample indexing, and gated accumulation to enable fast ALC loop control, especially for pulse-modulated RF signals. In other embodiments, the ALC circuit implements multi-level control for multi-level RF signals. In this manner, the RF generator uses the ALC circuit to generate an RF signal with a constant power level for RF signals having any pulse shape or output levels.

The ALC circuit of the present disclosure can be applied in an RF generator generating a continuous wave (CW) RF signal or a pulse-modulated RF signal or a ramp RF signal or other RF signal waveforms. However, the ALC circuit of the present disclosure can be applied advantageously to pulse-modulated RF signals, especially pulse modulated RF signals with short pulse width. In some examples, the ALC circuit of the present disclosure does not require oversampling but instead can be implemented with sampling of the RF signal at a frequency lower than the RF frequency.

In other embodiments of the present disclosure, clock generation circuits for synchronizing a slave clock signal with the master clock signal of the RF signal are described. In one embodiment, a clock generation circuit in an impedance matching system synchronizes a slave clock with a clock signal of the RF signal when the load impedance is resistive only. In this manner, the slave clock can be synchronized with the RF signal without phase shift due to non-resistive load impedance. In other embodiments, the slave clock is synchronized with the master clock of the RF signal and the impedance matching system generates sampling signals based on the synchronized slave clock.

Figure 1:
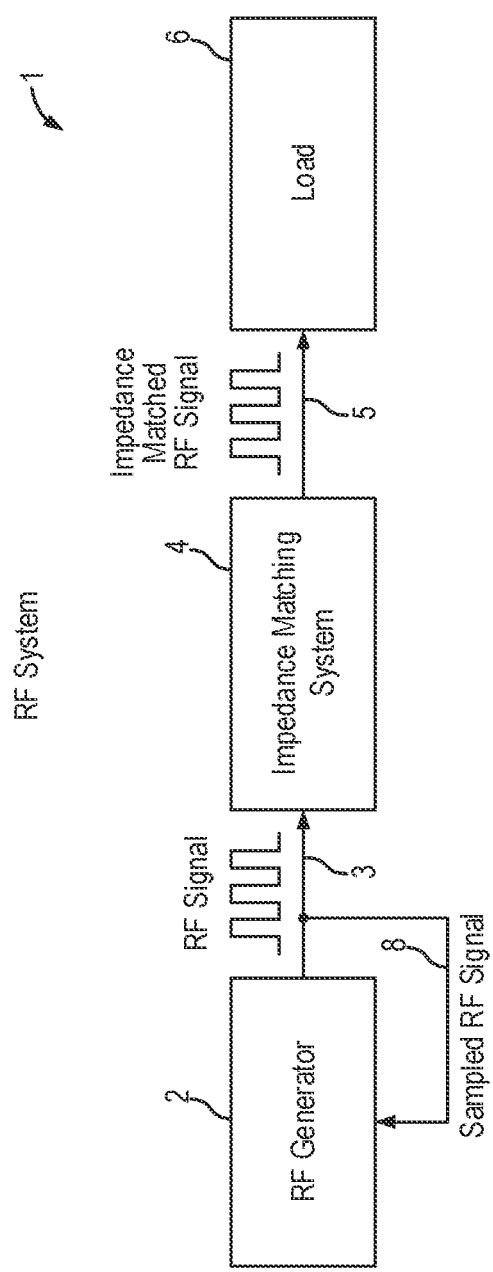
FIG. 1 is a schematic diagram of an RF system in which an RF generator is employed in some examples.

FIG. 1 is a schematic diagram of an RF system in which an RF generator is employed in some examples. Referring to FIG. 1, an RF system 1 is provisioned to supply an RF signal to a load 6. For example, the load 6 can be a semiconductor equipment, such as a plasma semiconductor equipment. The RF signal can be applied to generate the plasma in a plasma tool, such as for etching a semiconductor component. The RF system 1 includes an RF generator 2 generating the RF signal 3 having a predetermined RF frequency. In some examples, the RF signal 3 can be a continuous wave, such as a sinusoidal waveform, a ramp signal, or a pulse waveform. In other examples, the RF signal can be a burst signal or a pulse-modulated RF signal, that is, the RF signal is provided in bursts of RF signal with different pulse rate and/or different duty ratio. The RF signal 3 is provided to an impedance matching system 4 which matches the impedance of the RF signal to the desired impedance of the load 6. The impedance matching system 4 modifies the RF signal, such as the phase, the amplitude and other parameters of the RF signal, to convert the impedance of the RF signal to an impedance matched RF signal 5, which is provided to the load 6.

The RF generator 2 implements level control by measuring or sampling the RF signal at its output terminal. The sampled RF signals, which usually includes the forward RF signal from the power amplifier in the generator, is fed back to the RF generator 2 to form the control loop for adjusting the level or amplitude of the RF signal.

Embodiments of the present disclosure describe a RF generator incorporating an automatic level control (ALC) circuit for providing accurate level control of the output RF signal.

Figure 2:
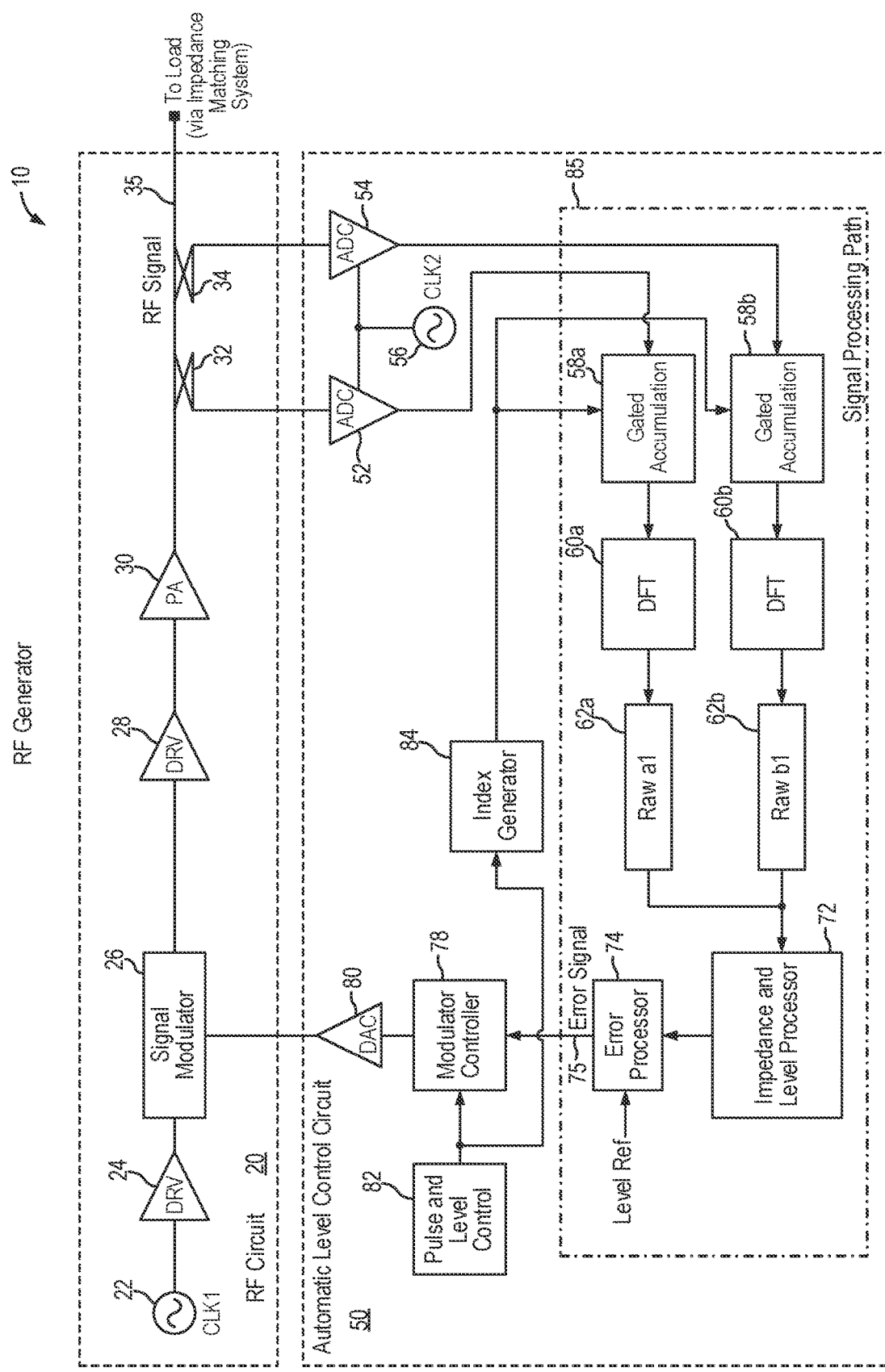
FIG. 2 is a schematic diagram of an RF generator incorporating an automatic level control (ALC) circuit in embodiments of the present disclosure.

FIG. 2 is a schematic diagram of an RF generator incorporating an automatic level control (ALC) circuit in embodiments of the present disclosure. Referring to FIG. 2, an RF generator 10 (also referred to as an "RF power supply") includes an RF circuit 20 and an automatic level control (ALC) circuit 50. The RF circuit 20 generates an RF signal from an RF signal source and provides the RF signal to an output terminal 35 for driving a load, usually via an impedance matching network. The ALC circuit 50 controls the RF circuit to generate the RF output signal with a controlled amplitude. The RF generator 10 may include other circuits and components not shown to support the functionality of the RF generator. Other circuits and components of the RF generator 10 are omitted in FIG. 2 to simplify the discussion.

In RF circuit 20, a signal generator 22 generates an RF source signal of a predetermined RF frequency as a function of an RF clock CLK1. In one example, the oscillator 22 generates the RF source signal being a fixed-level sine wave at the desired RF frequency. The RF source signal may be amplified by a driver 24. The RF source signal is then modulated by a signal modulator 26. The signal modulator 26 may be coupled to gate the RF source signal to generate a pulse-modulated RF signal. The signal modulator 26 may also be coupled to adjust the signal level, signal phase, the signal amplitude, or a combination of these parameters, of the RF source signal. In one example, the signal modulator 26 modulates the RF signal and adjusts the amplitude of the RF signal at the output of the signal modulator 26 based on the input level of an analog control signal provided by DAC 80. The modulated RF signal may be further amplified by a driver 28 and a power amplifier 30. For example, the power amplifier 30 amplifies the power of the RF signal outputted from the signal modulator 26 by a predetermined amplification factor. The power amplifier 30 amplifies the power of the RF signal to realize a desired signal amplitude for the output RF signal. The RF signal thus generated is provided on the output terminal 35 and can be transmitted to the load on a transmission line, such as an RF cable, to the load, via an impedance matching system.

In particular, the RF signal is provided to the output terminal 35 of the RF circuit 20 through a pair of directional couplers 32, 34. The directional couplers 32, 34 attenuate and extract respective forward power and a reflected power at the output terminal 35 where the sampled signals are used for monitoring the output level of the RF generator 10. In other words, each directional coupler measures a small fraction of the output power (the forward RF signal or the reflected RF signal) and diverts the measurements to the ALC circuit 50.

In the ALC circuit 50, the measurements of the forward RF signal outputted by the directional coupler 32 are provided to an analog-to-digital converter (ADC) 52 to be converted to digital data samples. Similarly, samples of the reflected RF signal outputted by the directional coupler 34 is provided to an analog-to-digital converter (ADC) 54 to be converted to digital data samples. The ADCs 52, 54 digitize the analog samples from the respective directional couplers at a sampling frequency based on a sampling clock CLK2, denoted by a clock source 56. In some embodiments, the directional coupler 32 is coupled to the ADC 52 through a signal amplifier and an attenuator. Similarly, the directional coupler 34 is coupled to the ADC 54 through a signal amplifier and an attenuator.

The digital samples of the forward and reflected RF signals are then processed by a signal processing path 85. The signal processing path 85 generates an error signal (node 75), or a vector error signal, indicative of a difference between the measured signal level value of the RF signal and a reference signal level (Level Ref). This difference may be a scalar value or vector value(s). The error signal (node 75) is provided to a modulator controller 78. The modulator controller 78 also receives a pulse modulation signal from a pulse and level control circuit 82. The modulator controller 78 receives other wave profile data from the pulse and level control circuit 82, such as for a ramp signal or a multi-level pulse modulation signal. The pulse modulation signal from the pulse and level control circuit 82 indicates the modulation to be applied to the RF signal, such as to generate a pulse-modulated or burst RF signal. The modulator controller 78 combines the error signal and the pulse modulation signal to generates a control signal which is converted to analog form by a digital-to-analog converter 80 and then provided to the signal modulator 26 to control the modulation of the RF source signal and also to modify the level or amplitude or phase of the RF source signal to generate an RF output signal with the desired pulse modulation and desired signal amplitude. As thus configured, a feedback loop is formed in the RF generator 10 to enable the ALC circuit 50 to continuously monitor and control the output power or output level of the RF signal. In some examples, the signal modulator 26 can be a multiplier combining the RF source signal and the control signal provided by the ALC circuit 50.

In the present description, the RF signal thus generated can be a continuous wave (CW) RF signal, such as in a sinusoidal signal, or a pulse train. or a ramp signal, or other amplitude modulated RF signal, such as a signal generated from an Arbitrary Wave Generator (AWG). Alternately, the RF signal can be a pulse-modulated RF signal. For example, a ramp RF signal includes continuously varying output level based on the reference level input to modulator controller 78. In another example, the level control signal from the pulse and level control circuit 82 may vary the amplitude of the RF output as a function of time. In the present description, a pulse-modulated RF signal, also referred to as a pulsed RF signal, refers to an RF signal of a given RF frequency having an On period where the RF signal is provided at an output terminal and an Off period where no RF signal is provided. That is, the RF signal of the given RF frequency is provided only during the On period. The On period and the Off period may be repeated and the pulsed RF signal may have the same or different pulse widths for each pulse of the RF signal.

In embodiments of the present disclosure, a salient feature of the ALC circuit 50 is the use of a synchronized ADC sampling clock. More specifically, the ADC sampling clock CLK2 is synchronized with the RF clock CLK1. In one example, both the ADC sampling clock CLK2 and the RF clock CLK1 can be synchronized or locked to a master clock (CLK0) and the ADC sampling frequency and the RF frequency can be derived from the master clock. Because of the use of the synchronized ADC sampling clock, fewer sampling points are needed to accurately sample the forward/reflected RF signal. In embodiments of the present disclosure, an ADC sampling frequency that is lower than the RF frequency can be used. By using a synchronized sampling clock, the ADCs 52, 54 sample the measured RF signal at the same location within each pulse period. Accordingly, fewer points are required for the ADCs 52, 54 to capture the peak of the RF signal pulse for which the level information is important. The ALC circuit 50 can realize a faster settling time as not many samples are needed in order to obtain the measured signal level value. In fact, the ALC circuit 50 can determine the control signal without using many digital samples. In one example, only digital samples within one RF signal period are needed.

In some embodiments, the sampling frequency of the ADCs 52, 54 is selected so that the intermediate frequency (IF) is aligned at one of the sampling points. In one example, the RF frequency is 11 MHz and a sampling frequency of 8.8 MHz is used. As a result, the mixed intermediate frequency (IF) from the ADC appears at 2.2 MHz. With the use of a 4 point FFT, one of the IF signals appears at the first FFT result which is 2.2 MHz. Accordingly, very few sampling point is needed to obtain the desired result. In another example, the RF frequency is 110 MHz and a sampling frequency of 80 MHz is used. As a result, the mixed intermediate frequency (IF) from the ADC appears at 30 MHz. With the use of an 8 point FFT, one of the IF signals appears at the third FFT result which is 30 MHz. Accordingly, the RF related data always appear at one of the FFT results, making the ADC sampling stable and accurate. As thus configured, the ALC circuit can be implemented using lower cost ADC and with fewer memory requirement.

In other embodiments, the sampling frequency can be greater than the RF frequency, especially when the RF frequency is low. For example, when the RF signal frequency is low, such as 1 MHz, the ADC sampling frequency can be 1.6 MHz. In that case, the IF frequency appears on 400 KHz. By applying a 4 point FFT at 1.6 MHz ADC sampling frequency, one of the FFT results is 400 KHz. The IF signal appears on the frequency, which meets the equation: IFFreq=|N×RFsignal±M×ADCsampling|. This configuration can be applied when the sampling frequency is an integer multiple (i.e. 1, 2, 3, 4 . . . ) of the IF frequency. In another embodiment, the configuration can also be applied when the ADC sampling is $2^N$ (or power of 2) of the RF frequency. For example, if the RF Frequency is 1 MHz and ADC sampling frequency is 4 MHz, the RF signal (magnitude and phase, etc.) can be sampled by using the 4 points FFT in the same manner as described above. Accordingly, one ADC, which has a wider RF input frequency, can be used to cover a wide range of RF frequencies. That is, the ADC circuit can be applied for a wide input RF frequency range.

With the use of the synchronized ADC sampling clock, each digital sample of the RF signal can be indexed or labeled. Furthermore, the index can be used to indicate the location of the digital sample taken on the RF signal pulse. In embodiments of the present disclosure, the ALC circuit 50 processes the digitized samples of the forward/reflected RF signals based on a sample index identifying the digital samples generated by the ADCs 52, 54. In one example, the ADC sampling is processed using a 4 point FFT (Fast Fourier Transform) and the four digital samples for each conversion taken within a period of the RF signal are labeled by sample indexes "0, 1, 2, 3." The sample indexes also indicate the phase locations of the digital samples taken within a period of the RF signal. For instance, the sample index 0 indicates a digital sample taken at the 0° phase angle, the sample index 1 indicates a digital sample taken at 90° phase angle, the sample index 2 indicates a digital sample taken at 180° phase angle, and the sample index 3 indicates a digital sample taken at 270° phase angle. With the digital samples taken by ADCs 52 and 54 thus indexed, the signal processing of the digital samples can be simplified and streamlined. In embodiments of the present disclosure, the ALC circuit 50 includes an index generator 84 for generating the sample index values for each digital sample provided by ADCs 52, 54. The index generator 84 receives the RF level related data from the pulse and level control circuit 82 and provides sample index values to the signal processing path 85.

Another salient feature of the ALC circuit of the present disclosure is that the ADC digitizing step uses a small number of FFT points, such as 4, 16, or 32. By enabling the use of a small number of FFT points and by using synchronized sampling clock, the ALC circuit can support shorter pulse width in the pulsed RF signal. The digital samples can be processed based on the sample index and therefore shorter pulse width of the pulsed RF signal can still be sampled accurately. When a large FFT is used, such as 4096, 32768 or 65536, the system requires more processing time when it has more data points. That slows down the throughput of the data output. The system would also require a faster ADC so that the system does not miss the short pulses. For example, when a small number of FFT points are used, only a short time is needed to perform a conversion to capture digital samples for one set of indexes. In one example, a 4 point FFT is used and the sampling time is 1 μs. One conversion requires only 4 μs to capture the digital samples for the whole set of indexes (0, 1, 2, 3). The captured digital samples can then be used to compute accurate phase and magnitude values. However, if the ALC circuit users a large FFT, such as 65536 point FFT, then the ALC circuit has to wait 65.536 ms to perform one conversion to capture the entire data set. Alternately, the system needs to use a faster ADC, which requires faster processor and larger buffer memories. When a large FFT is used, the ALC circuit cannot compute accurate phase and magnitude values from the slow sampling ADC, with only a subset of the captured digital samples and must wait for the entire data set to be captured.

The signal processing path 85 of the ALC circuit 50 will now be described in more details. After ADCs 52, 54 digitized the forward and reflected RF signals measured by the directional couplers 32, 34, the digitized samples are provided to respective gated accumulation blocks 58a, 58b. The gated accumulation blocks 58a, 58b determines which digital samples are to be used in the signal processing operation. In particular, the gated accumulation blocks 58a, 58b determine which digital samples are to be passed through for signal processing and which digital samples are to be blocked. In other words, the gated accumulation blocks 58a, 58b apply gating to the incoming digital samples based on the sample index to select certain digital samples to be passed to the signal processing operation.

The selected digital samples are provided to respective digital filters 60a, 60b to be processed. The digital filters 60a, 60b generate the processed values indicative of the signal level and the impedance of the measured forward and reflected RF signals. In some embodiments, the digital filters 60a, 60b are implemented as Discrete Fourier Transform filters. In the present embodiment, the digital filters 60a, 60b generate S-parameter related vector values "raw a1" (62*a*) and "raw b1" (62*b*) where each vector value is indicative of the magnitude and phase measured by the digital samples for the forward or reflected RF signal. More specifically, S-parameter related values "raw a1" and "raw b1" refer to the scattering parameters (or S-parameters) that are coefficients of the scattering matric representing a possible input-output path of the RF signal. The S-parameters are complex numbers with real and imaginary parts, representing magnitude and phase parts. The magnitude provides the level measurement and the phase provides the impedance measurement. That is, each S-parameter value has a magnitude value associated with the signal level of the RF signal and a phase value associated with the impedance as seen by the RF signal. Accordingly, the value "raw ai" represents the S-parameter value calculated from the forward RF signal transmitted onto the signal line and the value "raw bi" represents the S-parameter value calculated from the reflected RF signal. In the present description, the digital filters 60*a*, 60*b* generate "raw" S-parameters, which refer to the values "raw a1" and "raw b1" because these are uncalibrated values.

The processed values (raw a1 and raw b1) are provided to a processor 72 to compute the impedance and the level values for the sampled RF signals. The processor 72 can be implemented as a logic circuit or implemented as firmware executed in a processor. The processor 72 generates a measured signal level value for the RF signal. Alternately, in other embodiments, the processor 72 can provide vector error data or error data matrix. The measured signal level value is provided to a processor 74 for comparing the measured signal level value to the reference signal level (Level Ref). The processor 74 generates the error signal (node 75) indicative of the difference between the measured signal level value and the reference signal level. The processor 74 can be implemented as a logic circuit or implemented as firmware executed in a processor. As thus configured, the signal processing path 85 receives the digital samples of the forward and reflected RF signals and generates the error signal indicative of the difference between the measured signal level value and the reference signal level. The error signal (node 75) is provided to the modulator controller 78 to complete the ALC loop to control the level of the RF signal generated by the RF circuit 20.

In some embodiments, the gated accumulation block 58 selects digital samples only when the RF signal is provided (during the On period). During the RF signal Off period when no RF signal is provided, the signal processing path 85 may simply output the previously computed measured signal level values. By gating the digital samples to the On period only, the ALC loop can be implemented with reduced complexity and improved stability.

In the embodiment shown in FIG. 2, the signal processing path 85 illustrates separate gated accumulation blocks 58*a*, 58*b* for the digital samples of the respective forward RF signal and reflected RF signal. In the present description, the signal processing path is sometimes illustrated as including a single set of gated accumulation block and digital filter to process digital samples for both the forward and reflected RF signals. It is understood that the gated accumulation block and the digital filter are representative elements only and are used herein to denote circuitry for processing digital samples from one or more signal source. FIG. 2 and subsequent figures are illustrative only and not intended to be limiting.

Figure 3:
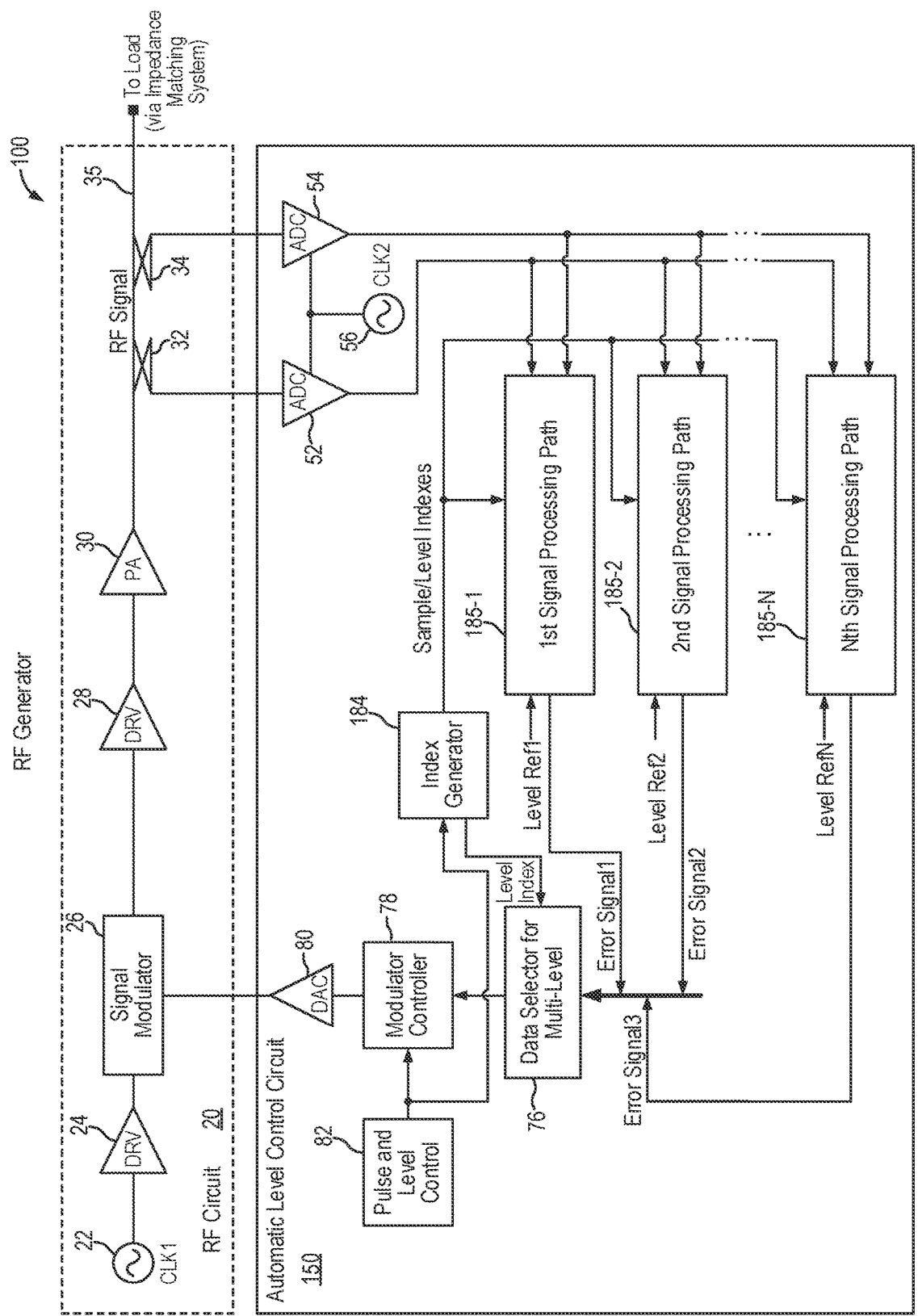
FIG. 3 is a schematic diagram of an RF generator incorporating an automatic level control (ALC) circuit for a multi-level RF signal in embodiments of the present disclosure.

In some embodiments, the RF generator generates a multi-level RF signal. That is, the RF signal can have two or more signal levels. For a pulse-modulator RF signal, each pulse or each burst of the RF signal may have the same or different signal levels. In embodiments of the present disclosure, the ALC circuit can be configured to provide level control for a multi-level RF signal. FIG. 3 is a schematic diagram of an RF generator incorporating an automatic level control (ALC) circuit for a multi-level RF signal in embodiments of the present disclosure. Like elements in FIGS. 2 and 3 are given like reference numerals to simplify the discussion. Referring to FIG. 3, an RF generator 100 includes an RF circuit 20 generating an RF signal on an output terminal 35 which can be a multi-level RF signal. The RF generator 100 further includes an automatic level control (ALC) circuit 150 for providing level control of one or more levels of the RF signal. In ALC circuit 150, multiple signal processing paths 185-1 to 185-N are provided to process signal levels 1 to N of the RF signal. Each signal processing path 185 includes elements for processing the digital samples of the forward and reflected RF signals at one signal level. For example, each signal processing path 185 may include a gated accumulation block, a digital filter, and one or more processors for computing the measured signal level value from the digital samples and for computing the error signal indicative of the difference between the measured signal level value and the reference signal level for the respective signal level. For instance, a first signal processing path 185-1 is disposed to process the digital samples of the forward and reflected RF signals for the first signal level. The first signal processing path 185-1 generates an error signal-1 indicative of the difference between the measured signal level value for the first signal level and the reference signal level 1 associated with the first signal level. The ALC circuit 150 includes two or more signal processing path to generate the error signals for each of the signal levels of the RF signal.

To support multi-level RF signal, an index generator 184 provides a first index as the sample index for the digital samples and a second index as the level index to identify the signal levels. The sample index and the level index are provided to the gated accumulation block in the signal processing path to select the digital samples to be processed.

The error signals generated by all of the signal processing paths 185-1 to 185-N are provided to a data selector 76 which operates to select one of the error signals for the signal level the ALC circuit 150 is currently controlling. The selected error signal is then provided to the modulator controller 78 to generate the control signal, converted to analog form by the DAC 80, to modulate the signal level of the RF source signal to generate the multi-level RF signal having controlled amplifier.

Figure 4:
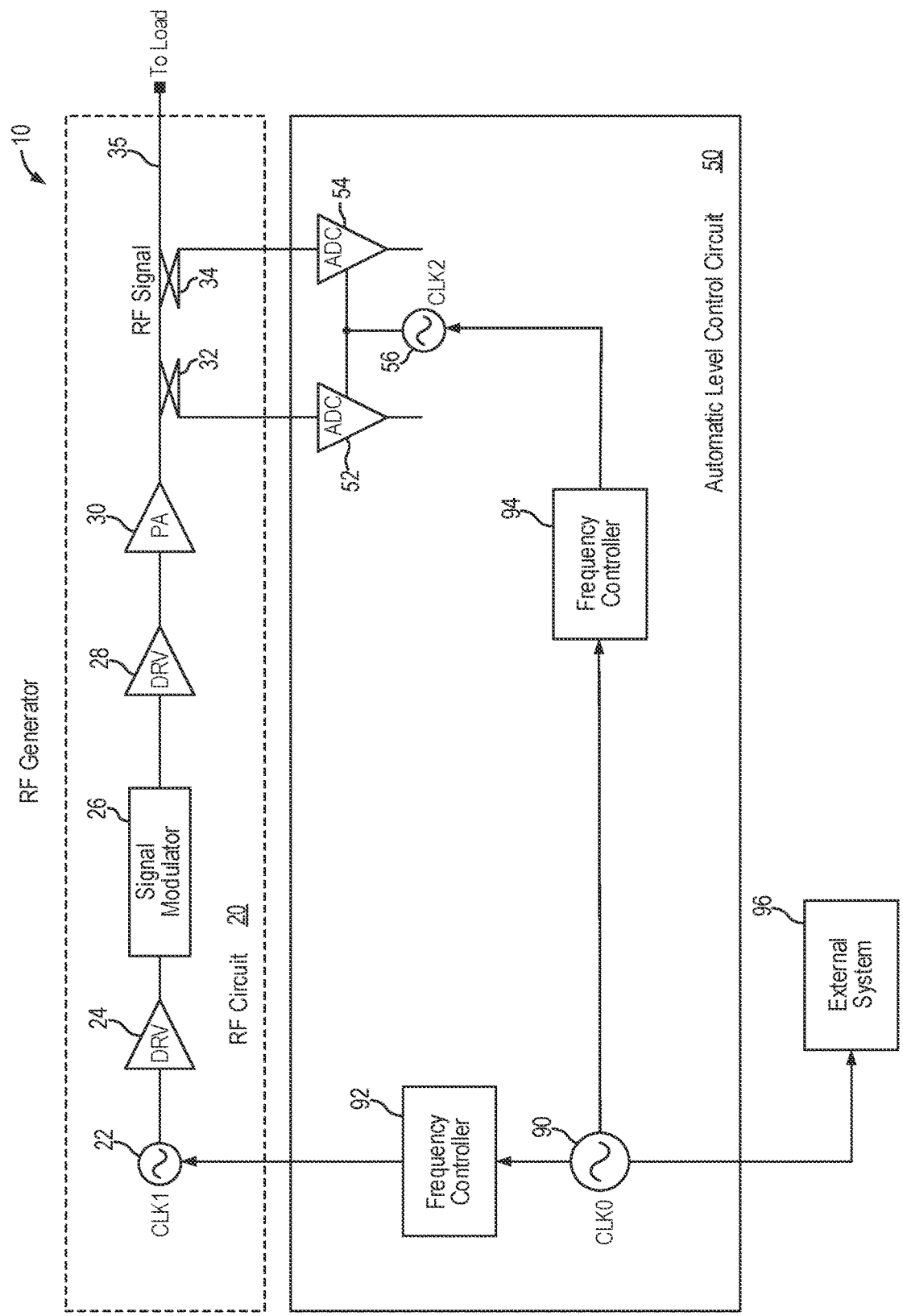
FIG. 4 illustrates the clock synchronization scheme implemented in the ALC circuit of the RF generator in some embodiments.

A salient feature of the ALC circuit of the present disclosure is the use of a synchronized ADC sampling clock. FIG. 4 illustrates the clock synchronization scheme implemented in the ALC circuit of the RF generator in some embodiments. Referring to FIG. 4, a master clock 90 provides a clock signal CLK0 having a given clock frequency. A frequency controller 92 is used to generate the clock signal CLK1 for the oscillator 22 in the RF circuit 20 to generate the RF source signal having a predetermined RF frequency. A frequency controller 94 is used to generate the clock signal CLK2 for use as the sampling clocks for the ADCs 52, 54. In this manner, the sampling clock CLK2 is synchronized to the RF clock CLK1 used to generate the RF signal. By using a synchronized ADC sampling clock, the ADC circuit 50 can implement sample index for more efficient sampling and processing. Furthermore, in embodiments of the present disclosure, the sampling frequency is at a lower frequency than the RF frequency.

In the present description, a synchronized ADC sampling clock refers to the sampling clock being synchronized to the RF clock used to generate the RF source signal while the two clocks may have different clock frequencies. In other words, the ADC sampling clock is locked to the RF clock while both clocks run at their respective frequencies. In one embodiment, the frequency controllers 92, 94 can be implemented as a phase-locked loop generating the sampling clock and the RF clock from a master clock CLK0.

In some embodiments, the master clock CLK0 can also be shared with an external system 96, such as the impedance matching network 4 of FIG. 1, to allow external systems to synchronize to the same master clock.

Figure 5:
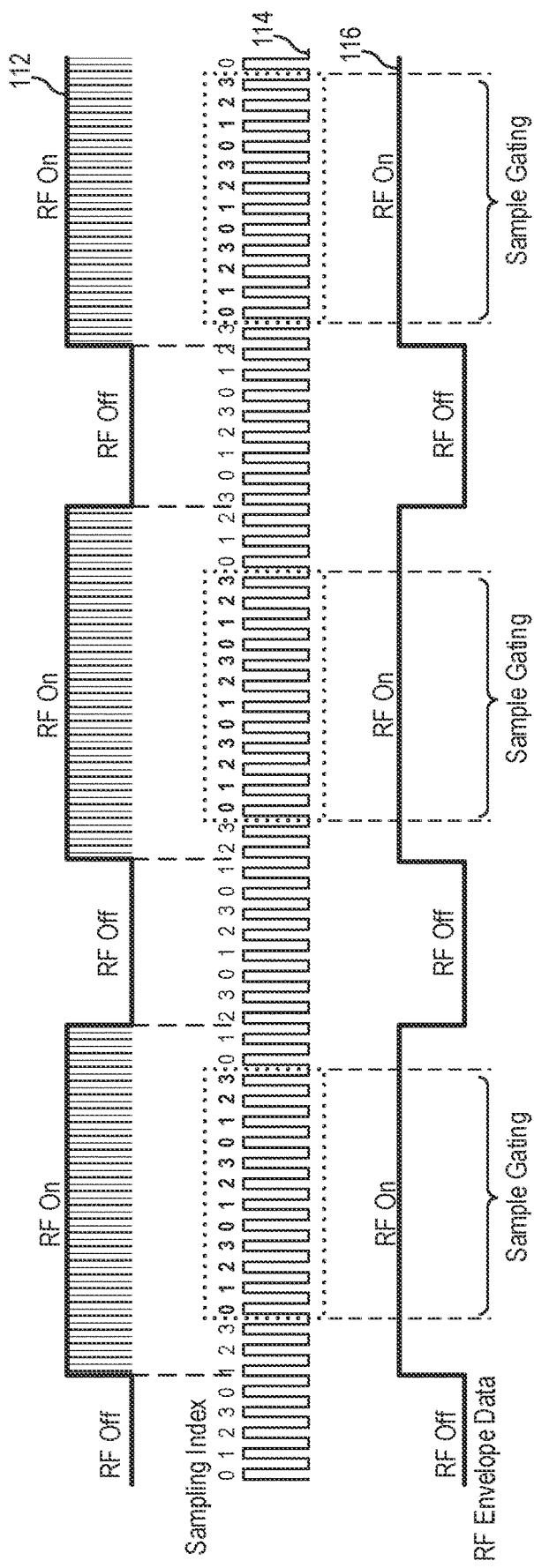
FIG. 5 illustrates a pulse-modulated RF signal and digital sampling thereof in examples of the present disclosure.

FIG. 5 illustrates a pulse-modulated RF signal and digital sampling thereof in examples of the present disclosure. Referring to FIG. 5, the RF signal (curve 112) is a pulse-modulated RF signal including On period when the RF signal is provided at the predetermined RF frequency and Off period when no RF signal is provided. The ADC digitizes the pulse-modulated RF signal and generates digital samples in response to the sampling clock, depicted by curve 114. Because the sampling clock is synchronized to the RF clock, each digital sample can be indexed and the location of each digital sample relative to the RF pulse is known.

In the present example, the ADC sampling uses a 4 point FFT where four samples are used to measure the analog signal in each sampling cycle, with each sample providing the same amount of phase shift. The sample indexes 0, 1, 2 and 3 therefore indicate the four samples that are taken within one conversion. In some embodiments, the index generator 84 (FIG. 2) generates the sample index 0, 1, 2 or 3 for each sampling pulse. The index generator 84 also receives the pulse modulation signal which provides the envelope of the pulse-modulated RF signal. The index generator 84 therefore can associate each sampling pulse with the On or Off period of the pulse-modulated RF signal. As thus configured, the gated accumulation block can select the digital samples associated with RF samples during the On period only.

In the embodiment shown in FIG. 5, In the present embodiment, the gated accumulation block is configured to select digital samples using the set of indexes 0-1-2-3 within the On period of the RF signal. Accordingly, the gated accumulation block selects the digital samples associated with indexes 0-1-2-3, 0-1-2-3 and so on, within the On period of the RF signal, as illustrated by curve 116.

Figure 6:
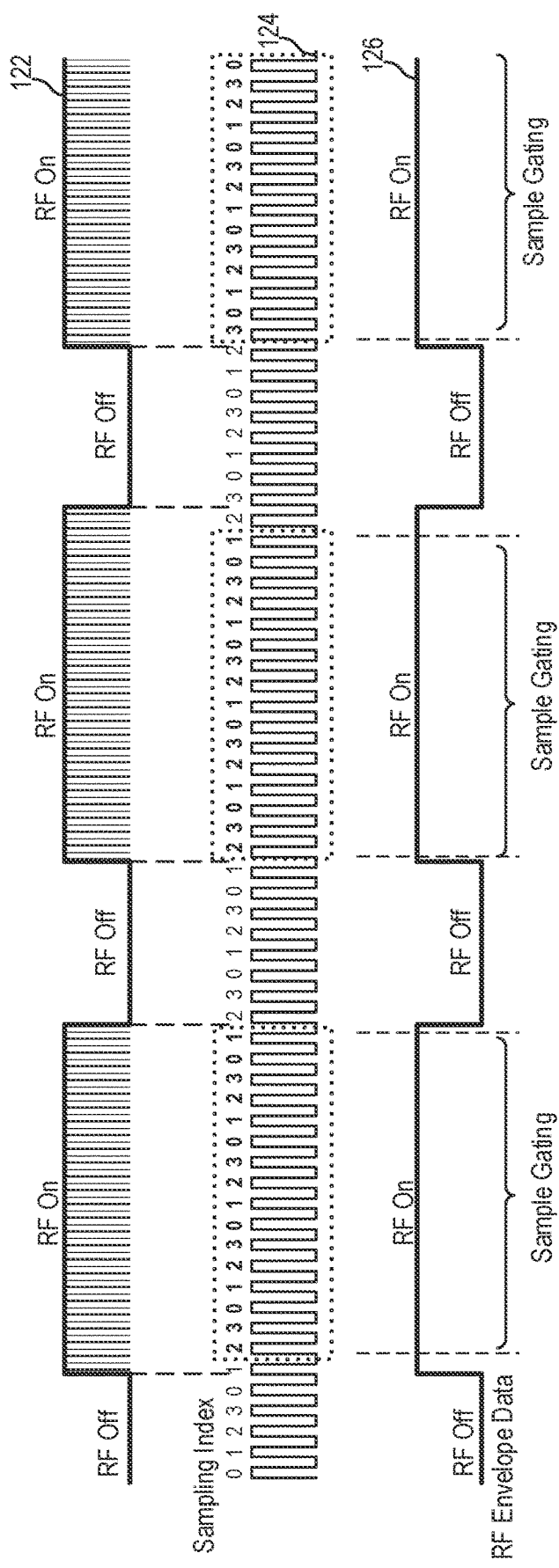
FIG. 6 illustrates a pulse-modulated RF signal and digital sampling thereof in examples of the present disclosure.

In other embodiments, the gated accumulation block can be configured to select digital samples using other index order or other sets of indexes. FIG. 6 illustrates a pulse-modulated RF signal and digital sampling thereof in examples of the present disclosure. Referring to FIG. 6, the gated accumulation block is configured to select digital samples using the set of indexes 2-3-0-1 within the On period of the RF signal (curve 122) for the first and second RF signal pulses and using the set of indexes 3-0-1-2 (curve 124) for the third RF signal pulse, as illustrated by curve 126. When using the index order 2-3-0-1, there are two index shifts (from 0) and the signal processing path adds the phase offset values corresponding to two index shifts. When using the index order 3-0-1-2, there are three index shifts (from 0) and the signal processing path add the phase offset values corresponding to three index shifts.

More specifically, the ALC circuit of the present disclosure can determine the set of digital samples to use depending on the width of the pulse-modulated RF signal. If the width of the RF signal On period is long, the ALC circuit can select any order of pulse signals, such as 0-1-2-3 or 2-3-0-1 and enough digital samples can be captured. However, if the width of the RF signal On period is short, then the ALC circuit has the flexibility to select a suitable order of sample index to use to maximize the digital samples being captured.

The use of sample index to select digital samples for processing is particularly advantageous for pulse-modulated RF signals. This is because the pulse-modulated RF signal often contains overshoot and undershoot during the transition between the On and Off periods. The gated accumulation block in the ALC circuit of the present disclosure can be configured not to select the initial digital samples just as the RF signal is turned on but instead wait to select digital samples when the RF signal is more stable. Furthermore, the gated accumulation block can be configured not to select digital samples at the end of the On period when the RF signal is about to be turned off.

Figure 7:
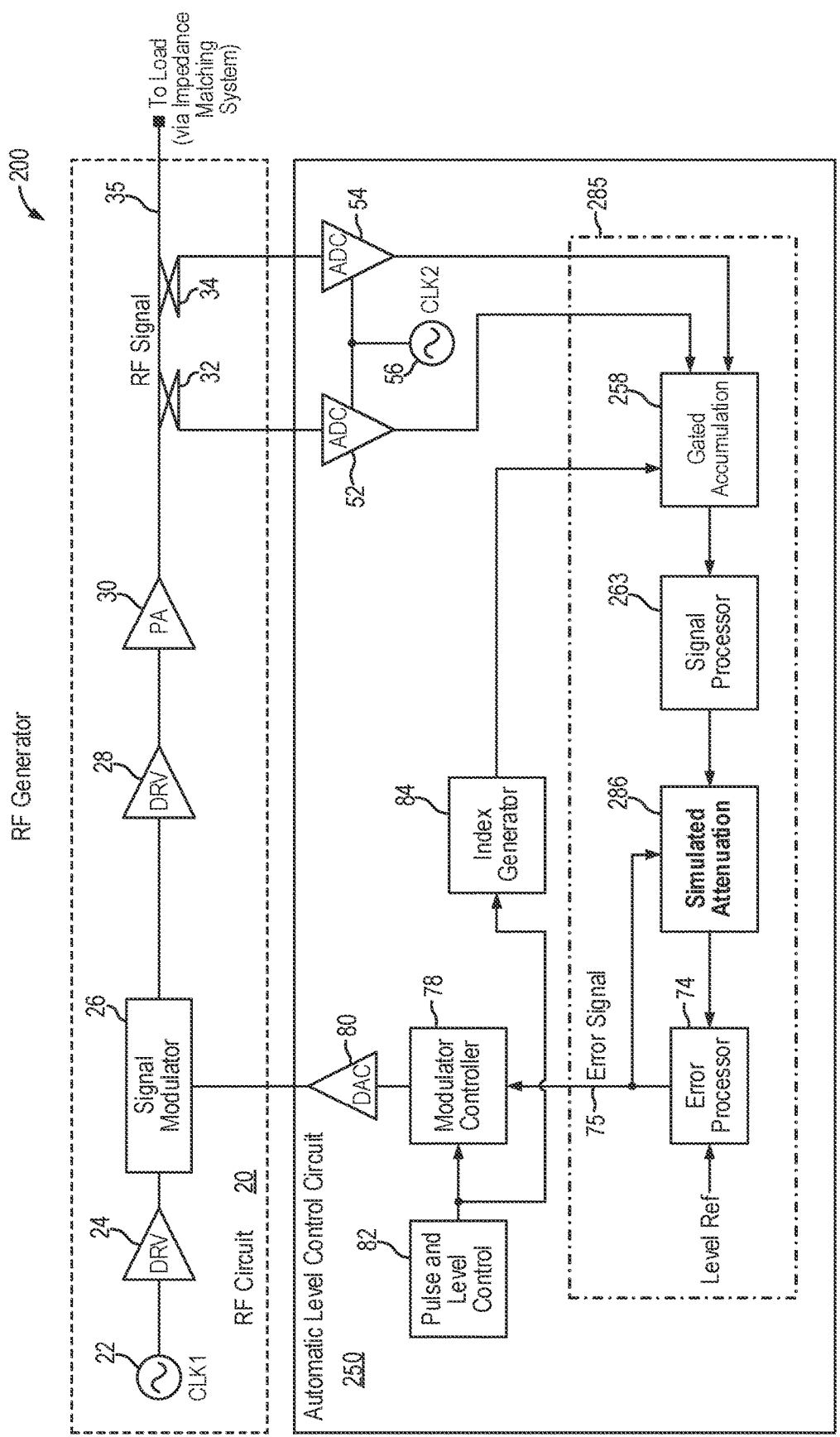
FIG. 7 is a schematic diagram of an RF generator incorporating an automatic level control (ALC) circuit in embodiments of the present disclosure.

FIG. 7 is a schematic diagram of an RF generator incorporating an automatic level control (ALC) circuit in embodiments of the present disclosure. Like elements in FIGS. 2 and 7 are given like reference numerals to simplify the discussion. Referring to FIG. 7, an RF generator 200 includes an RF circuit 20 and an automatic level control (ALC) circuit 250. The ALC circuit 250 includes a signal processing path 285 configured to receive digital samples from measurements of the forward and reflected RF signals and to generate the error signal (node 75) for the modulator controller 78 in the ALC loop. In the present embodiment, the signal processing path 285 includes a gated accumulation block 258 for selecting the digital samples from each of the sampled forward and reflected RF signals. The signal processing path 285 further includes a signal processor 263 to process the digital samples. In the present example, the signal processor 263 includes a digital filter and a processor or logic circuit for computing a measured signal level value from the digital samples. The measured signal level value is used to generate the error signal for the modulator controller 78 for power level control.

Furthermore, the signal processing path 285 in the ALC circuit 250 of the present embodiment further includes a simulated attenuation circuit 286 for generating a simulated signal level value during the Off period of the pulse-modulated RF signal. In particular, during the On period of the pulse-modulated RF signal where the ADCs 52, 54 sample the RF signal, the signal processor 263 generates the measured signal level value which is passed through the simulated attenuation circuit 286 and provided to the error processor 74. However, during the Off period of the pulse-modulated RF signal, the ADCs 52, 54 do not have any RF signal to sample and the signal processor 263 may not generate an output with a meaningful value. In that case, the error processor 74 may be put in an undesirable state, leading to an error signal that is out of range. When the RF signal is back on again, the error processor may then have a large error to correct, causing longer settling time and unstable output power for the RF signal.

In embodiments of the present disclosure, the simulated attenuation block 286 estimates or simulates the RF signal (or the transfer function of the analog/RF signal path within the ALC loop) during the Off period of the pulse modulated RF signal. In particular, the simulated attenuation block 286 generates an estimated signal level value during the Off period of the pulse modulated RF signal and provides the estimated signal level value to the error processor 74 so that the error processor 74 can generate an error signal that is not widely out of range but closer to the expected value. In this manner, when the pulse-modulated RF signal enters the On period next, the ALC loop can quickly settle onto the error signal that is required to control the signal level or the power of the RF signal.

In one embodiment, the simulated attenuation block 286 generates the estimated signal level value using pre-measured transfer function of the control signal to the power amplifier. That is, the estimated signal level value describes the relationships between the control signal generated by the modulator controller and changes in the power amplifier. The simulated attenuation block 286 receives the previous error signal feedback and based on the transfer function, determines an estimated or simulated signal level value to be used when the pulsed RF signal is turned off. In this manner, the ALC loop behaves as if there is an RF signal being sampled. The error signal can be set closer to the expected value so that when the RF signal is turned on, the error signal and the ALC loop does not suffer a large signal swing. In some embodiments, the simulated attenuation block 286 can be implemented as a logic circuit or as firmware in a processor.

In this manner, even if the pulse modulated RF signal is in the Off period with no RF signal, the signal processing path provides an estimated or simulated signal level value to provide the ALC loop an appropriate error signal to generate the control signal for the RF circuit. The control loop can operate efficiently without big signal swings when the RF signal is turned back on during the On period.

Figure 8:
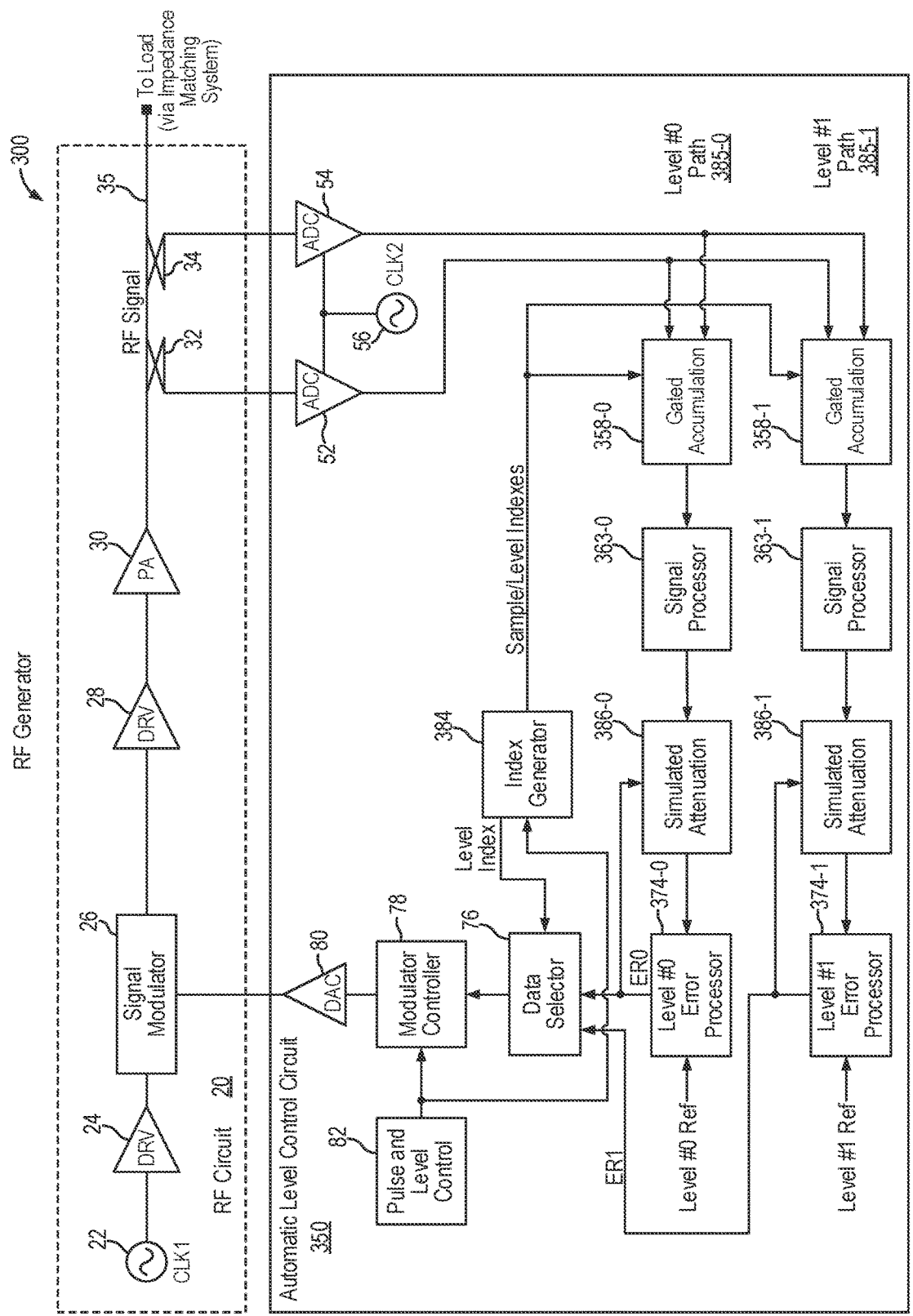
FIG. 8 is a schematic diagram of an RF generator incorporating an automatic level control (ALC) circuit for a multi-level RF signal in embodiments of the present disclosure.

FIG. 8 is a schematic diagram of an RF generator incorporating an automatic level control (ALC) circuit for a multi-level RF signal in embodiments of the present disclosure. Like elements in FIGS. 2, 3 and 8 are given like reference numerals to simplify the discussion. In particular, FIG. 8 illustrates an embodiment of the ALC circuit for a multi-level RF signal having two signal levels. Referring to FIG. 8, in the case the RF signal has two signal levels—level #0 and level #1—the ALC circuit 350 includes two signal processing paths: Level #0. Path 385-0 and Level #1 Path 385-1. Each signal processing path 385-0, 385-1 receives the digital samples of the forward and reflected RF signal from ADCs 52, 54. Each signal processing path 385-0, 385-1 selects the digital samples associated with the respective signal level for processing. For example, the index generator 384 receives the pulse modulation signal from the pulse and level control circuit 82 and provides a sample index and a level index to the gated accumulation blocks 358-0 and 358-1. The level index indicates whether the digital samples belong to the signal level 0 or the signal level 1 so that each signal processing path can process accordingly.

Each signal processing path 385-0, 385-1 includes a gated accumulation block 358, a signal processor 363, a simulated attenuation block 386 and an error processor 374. The signal processing path 385-0 generates an error signal ER0 indicative of a difference between a measured or estimated signal level value and the reference signal level for signal level #0. The signal processing path 385-1 generates an error signal ER1 indicative of a difference between a measured or estimated signal level value and the reference signal level for signal level #1. A data selector 76 selects one of the error signals ER0 and ER1 for the modulator controller 78. The data selector 76 selects the appropriate error signal by receiving the level index from the index generator 384. The modulator controller 78 generates the control signal for controlling the signal modulator 26 in the RF circuit to adjust the RF source signal to the desired controlled signal level.

In some applications, the ALC circuit may be configured to apply level control for one signal level only. For example, the ALC circuit may be configured to control signal level #1 only. In that case, the data selector 76 can be configured to only select the error signal ER1 and the ALC circuit controls the signal level only during the On period of the RF signal having the signal level #1. For example, if the pulse-modulated RF signal has a long pulse width, then the ALC circuit 250 may be configured to level control both of the signal levels. However, if the pulse-modulated RF signal has a short pulse width, then the ALC circuit 250 may be configured to level control only one of the signal levels to ensure a faster response.

Figure 9:
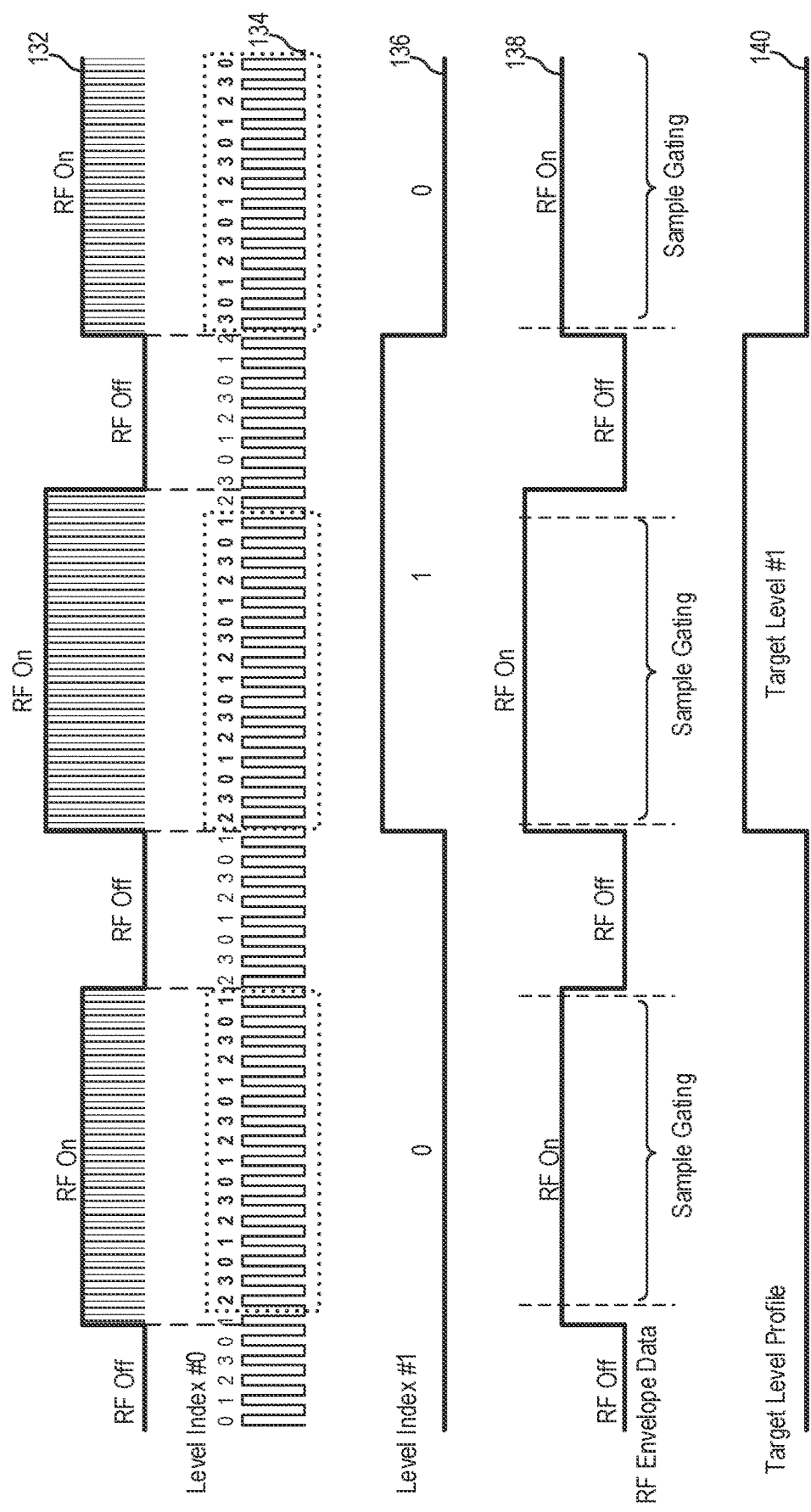
FIG. 9 illustrates a multi-level pulse-modulated RF signal and digital sampling thereof in examples of the present disclosure.

FIG. 9 illustrates a multi-level pulse-modulated RF signal and digital sampling thereof in examples of the present disclosure. Referring to FIG. 9, the multi-level RF signal (curve 132) is a pulse-modulated RF signal including On period when the RF signal is provided at the predetermined RF frequency and Off period when no RF signal is provided. Furthermore, the RF signal includes a first signal level (level #0) and a second signal level (level #1). For example, the first and third pulses are of level #0 and the second pulse is of level #1.

The ADC digitizes the pulse-modulated RF signal and generates digital samples in response to the sampling clock, depicted by curve 134. In the present example, the ADC sampling uses a 4 point FFT where four samples are used to measure the analog signal in each sampling cycle, with each sample providing the same amount of phase shift. The sample indexes 0, 1, 2 and 3 therefore indicate the four samples that are taken for one conversion. In some embodiments, the index generator 384 (FIG. 8) generates the sample index 0, 1, 2 or 3 for each sampling pulse. The index generator 384 further generates the level index (curve 136) to indicate the signal level of the RF signal. In the present example, only 1 bit is needed for the level index to indicate two signal levels.

The index generator 384 receives the pulse modulation signal which provides the envelope of the pulse-modulated RF signal as well as the signal level for each pulse. The index generator 384 therefore can associate each sampling pulse with the On or Off period of the pulse-modulated RF signal as well as the signal level of the RF signal. As thus configured, the gated accumulation block can select the digital samples associated with RF samples during the On period and also for specific signal level—level #0 or level #1.

In the embodiment shown in FIG. 9, the gated accumulation block is configured to select digital samples using an index order that maximizes the number of digital samples captured during each On period. In the present example, the gated accumulation block is configured to select digital samples using an index order 2-3-0-1 within the On period of the RF signal for the first and second RF signal pulses and using an index order 3-0-1-2 (curve 134) for the third RF signal pulse, as illustrated by curve 138. FIG. 9 further illustrates the target signal level for the RF signal (curve 140) to which the ALC circuit should be regulating.

In the above described embodiments, the RF circuit of the RF generator uses an oscillator to generate an RF source signal and a signal modulator to modulate the RF source signal in response to a control signal to generate the desired RF signal. In this case, a DAC is used to convert the digital control signal generated by the modulator controller to an analog control signal to drive the signal modulator. In alternative embodiments of the present disclosure, the RF circuit can be implemented using a digital signal generator and the ALC circuit can control the RF circuit using digital control signals.

Figure 10:
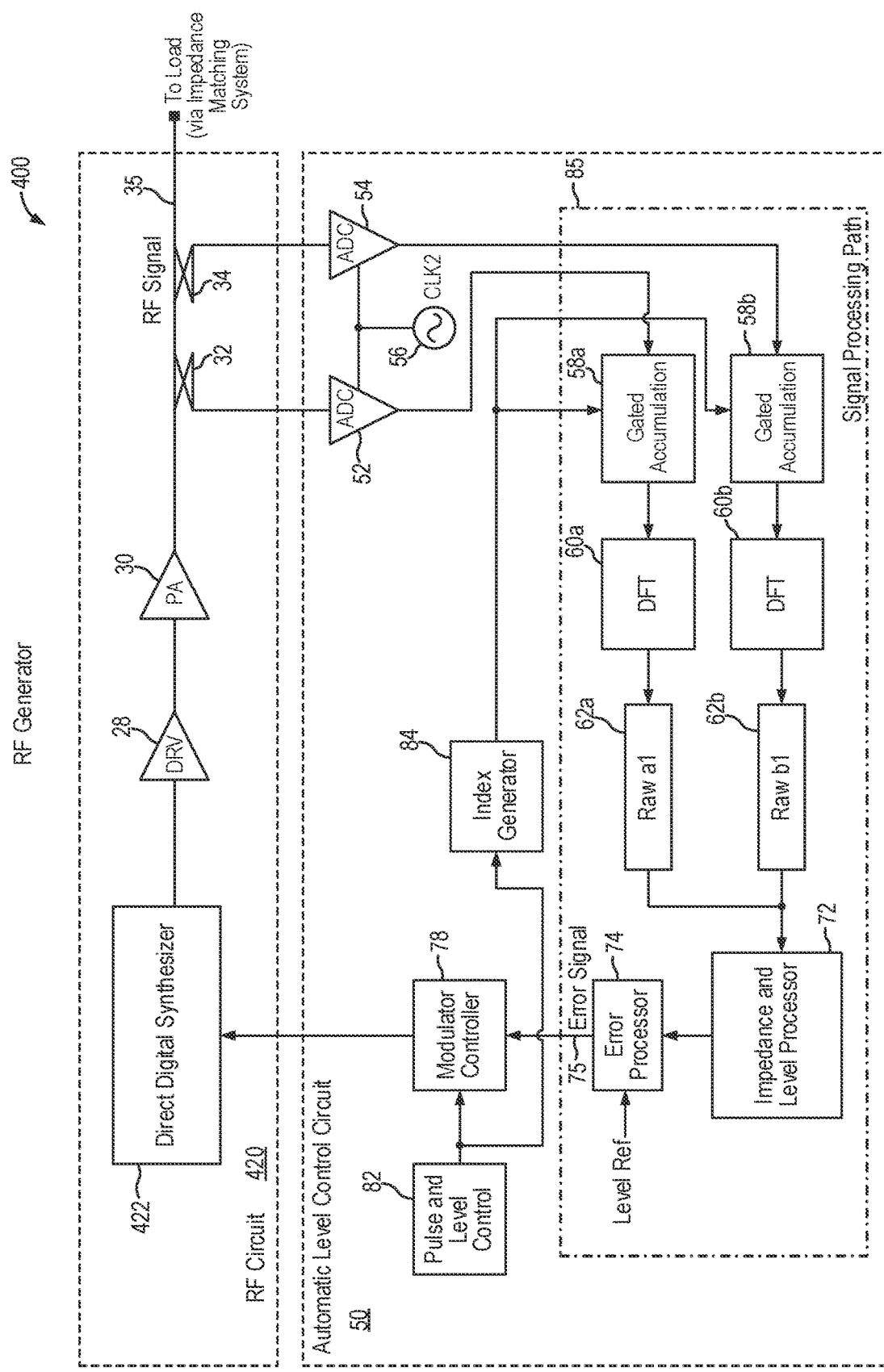
FIG. 10 is a schematic diagram of an RF generator incorporating an automatic level control (ALC) circuit in alternate embodiments of the present disclosure.

FIG. 10 is a schematic diagram of an RF generator incorporating an automatic level control (ALC) circuit in alternate embodiments of the present disclosure. Referring to FIG. 10, an RF generator 400 includes an RF circuit 420 and an automatic level control (ALC) circuit 50. In the present embodiment, the automatic level control circuit 50 is implemented in the same manner as the ALC circuit 50 in FIG. 2. Like elements in FIGS. 2 and 10 are given like reference numerals and will not be further described. RF circuit 420 includes a direct digital synthesizer 422 to generate the desired RF signal in response to the control signal from the modulator controller 78 of the ALC circuit 50. In particular, the direct digital synthesizer 422 is a direct digital synthesizer with modulation capability and is capable of creating or generating from an internal reference frequency an output signal having any desired frequency or amplitude or phase. In embodiments of the present disclosure, the direct digital synthesizer 422 is configured to generate an RF signal having the desired signal amplitude and phase in response to the control signal form the modulator controller 78. Because the direct digital synthesizer 422 responds to digital signal input, the ALC circuit 50 can provide the control signal from the modulator controller 78 and digital-to-analog conversion of the control signal is not needed. The direct digital synthesizer 422 includes an internal DAC to generate the RF signal in response to the digital control signal from the modulator controller 78.

In yet other embodiments, the RF circuit can be implemented using a phase-locked loop (PLL) signal source with modulation capability. The PLL signal source can operate in the same manner as the direct digital synthesizer to provide an RF signal having the desired frequency, amplitude, or phase in response to a digital control signal. In other embodiments, the RF circuit can also be implemented using an FPGA or a processor with digital-to-analog conversion capability.

In an RF system, the RF generator and the impedance matching system are two independent systems and are usually not synchronized. To construct the RF system using the RF generator, the impedance matching system needs to recover the clock being used by the RF generator. In embodiments of the present disclosure, circuits and methods in an impedance matching system to recover the clock signal from the RF generator are described.

Figure 11:
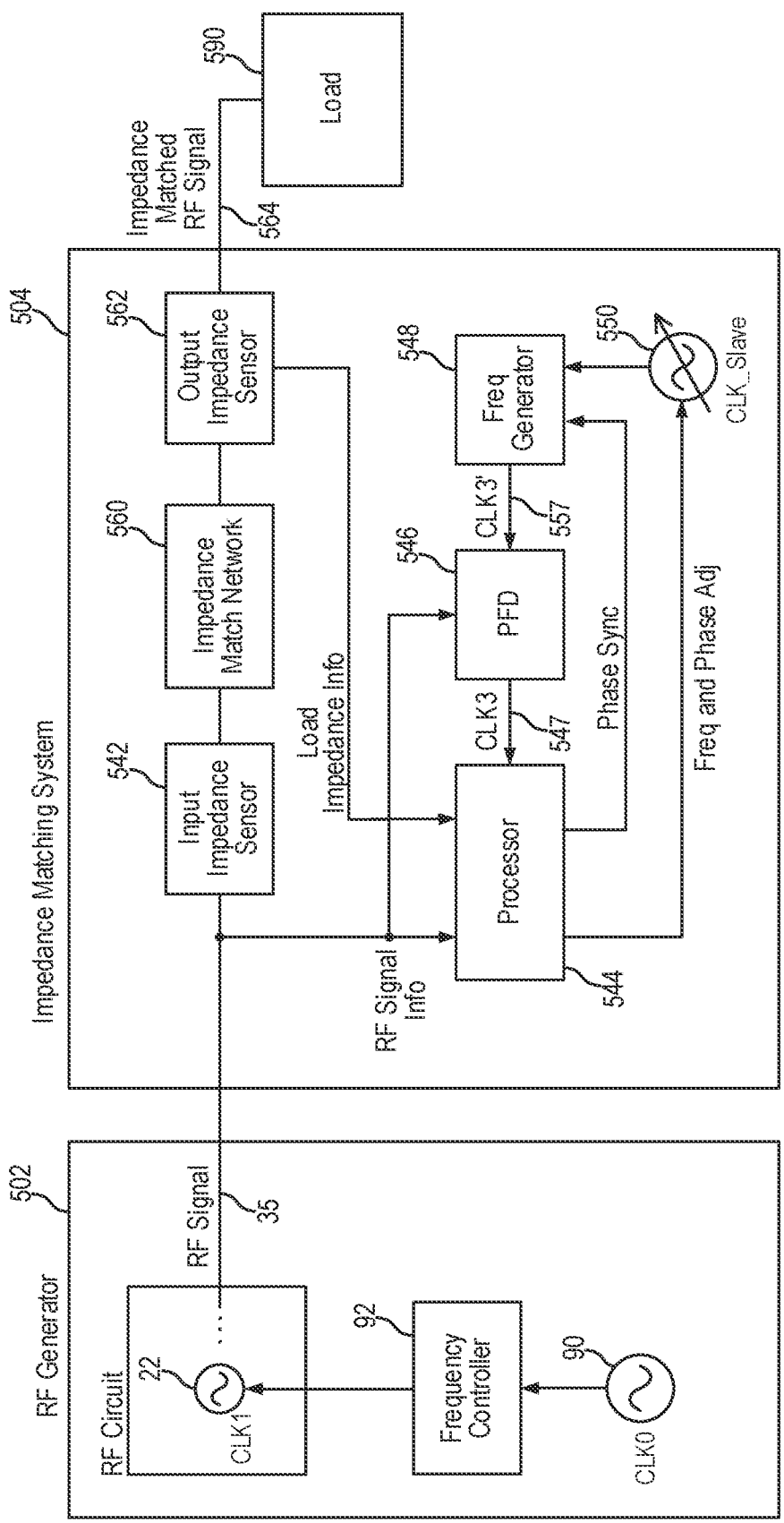
FIG. 11 illustrates a clock generation circuit in an impedance matching system coupled to an RF generator in embodiments of the present disclosure.

FIG. 11 illustrates a clock generation circuit in an impedance matching system coupled to an RF generator in embodiments of the present disclosure. Referring to FIG. 11, an impedance matching system 504 is coupled to an RF generator 502 in an RF system to receive an RF signal 35 and to provide an impedance matched RF signal 564 to a load 590. The impedance matching system 504 includes an input impedance sensor 542, an impedance match network 560 and an output impedance sensor 562 providing the impedance matched RF signal 564.

Because the impedance matching system 504 and the RF generator 502 are independent systems, the impedance matching system 504 needs to reproduce the clock signal from the RF Signal (node 35) of the RF generator 502. For example, the impedance matching system 504 may want to sync to the master clock 90 (CLK0) of the RF generator. Alternatively, the impedance matching system 504 may sync to other clock signals in the clock chain in the RF generator 502, such as the clock source 22.

In practice, if the phase of the RF signal is determined only by the RF generator 502, then the impedance matching system 504 can lock its reference clock (also referred to as the slave clock) to the RF signal. However, the phase of the RF signal generated by the RF generator 502 changes in response to both the setting of the matching system and the load of the matching system. According to embodiments of the present disclosure, the input impedance sensor 542 of the impedance matching system 504 determines the impedance at the input node. The impedance matching system 504 attempts to lock the slave clock 550 when the input impedance sensor 542 report a fixed phase, or a predetermined phase condition. In this case, the slave clock 550 will lock to the RF signal of the RF generator 502, whenever the impedance matching system 504 sees the same phase condition.

In other embodiments of the present disclosure, a clock generation circuit is provided in the impedance matching system 504 to enable the impedance matching system to recover the RF clock (master clock) from the RF signal received on the transmission line. The clock generation circuit receives the RF signal from the RF generator 502 and also receives the load impedance information from the output impedance sensor 562. In particular, the clock generation circuit uses the RF signal only when the output impedance sensor 562 indicates the load impedance is resistive. By synchronizing the clock of the impedance matching system only when the load is resistive, no phase shift occurs in the impedance matching system and the slave clock signal thus generated has high stability.

In one embodiment, the output impedance sensor 562 taps and measures the impedance matched RF signal 564 to obtain the load impedance information. The clock generation circuit includes a processor 544 which receives the load impedance information as well as the incoming RF signal 35 from the RF generator 502. A clock generator 550 generates a slave clock signal which drives a frequency generator 548 to generate a clock signal CLK3' (node 557). The frequency generator 548 can be implemented as a phase-locked loop. Finally, the clock generation circuit includes a phase frequency detector 546 which receives the clock signal CLK3' and the incoming RF signal and measures the phase difference between the two signals. The phase frequency detector 546 aligns the phase of the clock signal CLK3' to the incoming RF signal to generate the clock signal CLK3 which is provided to the processor 544.

In operation, the processor 544 keeps counting the number of the pulses within a certain time period. When the processor 544 compares and recognizes differences between the clock signal of the RF signal and the clock signal CLK3, the processor 544 adjusts the frequency and/or the phase of the slave clock 550 within the impedance matching system. For example, the processor 544 may manipulate the DAC output at the processor 544.

In embodiments of the present disclosure, the clock generation circuit examines the load impedance of the load 590 as measured by the output impedance sensor 562 and detects when the input impedance of the load is resistive. When the input impedance of the load is resistive, the clock generation circuit then measure the phase difference between the locally generated clock CLK3 and the RF signal and generate the frequency and phase adjust signal to the slave clock 550. In this way, the slave clock 550 of the impedance matching network 504 can be synchronized to the same phase as the RF clock. When the load impedance of the load is not resistive, that is if the load impedance is capacitive or inductive, the clock generation circuit does not synchronize the clock signal as the non-resistive load impedance results in phase variations. In this manner, a phase synchronized local clock signal for the impedance matching system is generated from the RF signal.

In some embodiments, the processor 544 determines when the load impedance is a resistive load only and initiates the frequency and phase synchronization by triggering the phase sync signal coupled to the frequency generator 548. The frequency generator 548 can be a phase-locked loop and receives a clock signal from the slave clock 550. The frequency generator 548 is coupled to a phase frequency detector 546 to generate the local clock CLK3. The phase frequency detector 546 measures the phase difference between the internal clock CLK3' and the RF clock from the RF clock signal. The frequency and phase adjustment values are provided by the processor 544 to the slave clock 550 to adjust the clock frequency and phase to match the RF clock signal in the RF signal.

Figure 12:
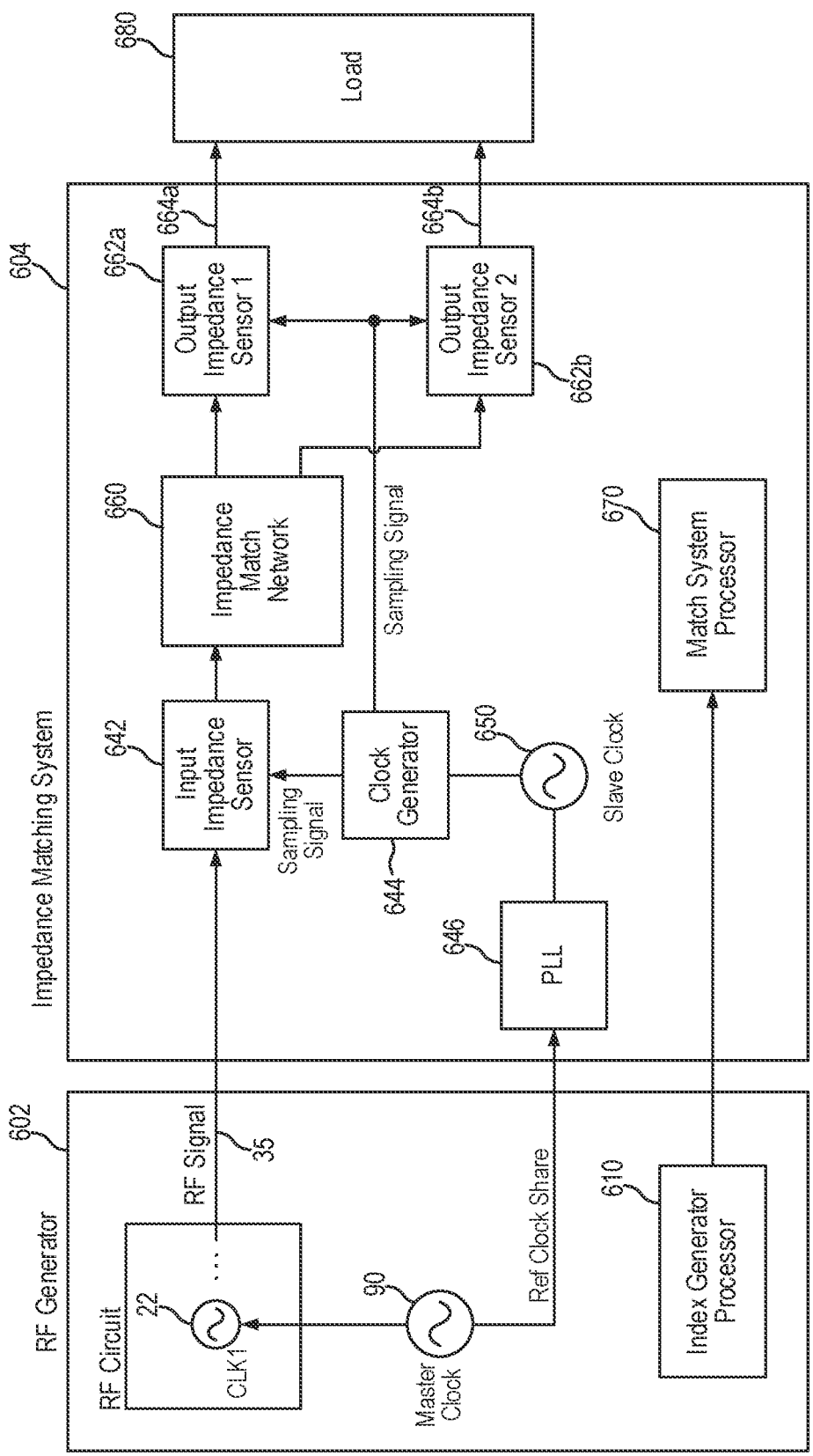
FIG. 12 illustrates a clock generation circuit in an impedance matching system coupled to an RF generator in alternate embodiments of the present disclosure.

FIG. 12 illustrates a clock generation circuit in an impedance matching system coupled to an RF generator in alternate embodiments of the present disclosure. Referring to FIG. 12, an impedance matching system 604 is coupled to an RF generator 602 in an RF system to receive an RF signal 35 and to provide an impedance matched RF signals 664a, 664b to a load 680. The impedance matching system 604 includes an input impedance sensor 642, an impedance match network 660 and an output impedance sensor 662 providing the impedance matched RF signal 664. In the present embodiment, the impedance matching system 604 includes two output impedance sensor 1 and 2 662a, 662b to provide two output RF signals 664a, 664b, respectively.

In the RF system of FIG. 12, the master clock, or the reference clock, of the RF generator 602 is shared with the impedance matching system 640. Furthermore, the sample index generated in the RF generator 602 is also shared with the impedance matching system 640. For example, the master clock 90 of the RF generator 602 may be shared with the impedance matching system 604, such as by coupling the master clock 90 to a phase-locked loop 646. The sample index generated by the index generator processor 610 are provided to the match system processor 670. By using the same clock and the same sample index, the impedance matching system 604 can process the sensor data within the matching system with greater efficiency.

More specifically, the phase-locked loop 646 drives an oscillator 650 in response to the master clock 90 being shared by the RF generator 602. The oscillator 650 provides an output clock signal to a clock generator 644 which, in the present embodiment, generates the sampling signals for the input impedance sensor 642 and the two output impedance sensors 662a, 662b. With the same clock signal and the same sample index, the input impedance sensors 642 and the output impedance sensors 664a, 664b can run at the same timing as the RF generator 602. In practice, there will be a certain amount of clock delay but the delay can be compensated.

In general, the clock synchronization scheme of FIG. 12 is implemented by sharing the clock signal and index data between two independent systems, and having the sample index to each sample and running the signal processing based on the shared clock and the shared sample index data.

In alternate embodiments, the clock synchronization between the RF generator 602 and the impedance matching system 604 can be performed in reverse. That is, the reference clock in the impedance matching system can be the master clock and the RF generator can synch to reference clock of the impedance matching system. Furthermore, the processor of the impedance matching system can generate the sample index and share the sample index with the RF generator.

In the impedance matching system 604 of FIG. 12, the same clock (slave clock 650) is used for both the input impedance sensor and the output impedance sensor. Therefore, the input frequency and the output frequency of the impedance matching system are the same. In some cases, the impedance matching system may be implemented using different clock frequencies for the input and output impedance sensors.

Figure 13:
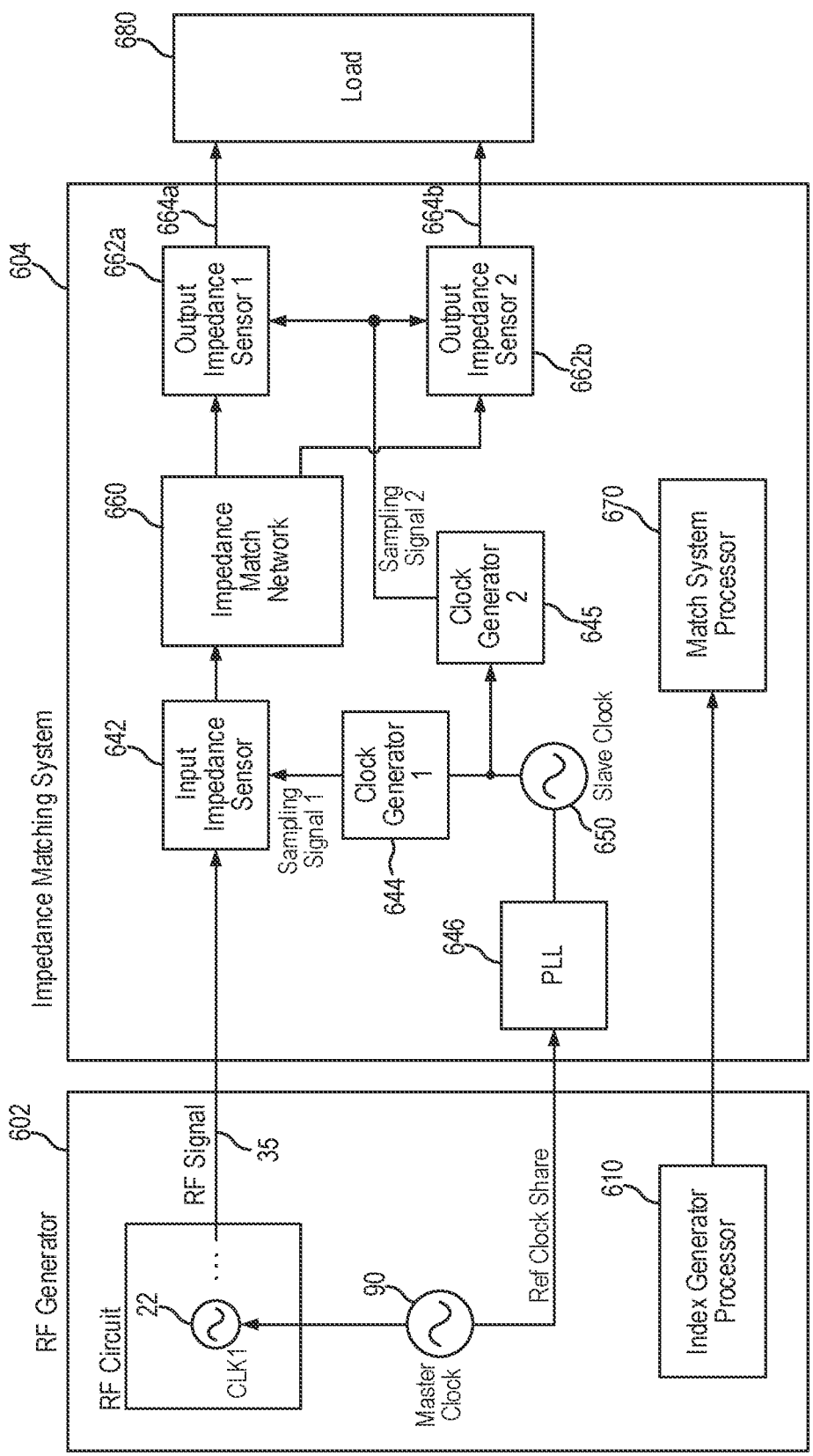
FIG. 13 illustrates a clock generation circuit in an impedance matching system coupled to an RF generator in alternate embodiments of the present disclosure.

FIG. 13 illustrates a clock generation circuit in an impedance matching system coupled to an RF generator in alternate embodiments of the present disclosure. Like elements in FIGS. 12 and 13 are given like reference numerals and will not be further described. Referring to FIG. 13, the impedance matching system 604 includes a first clock generator 1 (644) to generate a sampling signal 1 and a second clock generator 2 (645) to generate a sample signal 2. Both clock generators 644 and 645 generate the sampling signals based on the slave clock 650. In some examples, the clock generators 644 and 645 generate sampling signals with different frequencies. The impedance matching system 604 may apply the different clock frequencies for different sensors in the system. For example, in the present embodiment, the sampling signal 1 is applied to the input impedance sensor 642 and the sampling signal 2 is applied to one or both of the output impedance sensor 662a, 662b.

In one example, it may be desirable to see the harmonics frequency of the RF signal at the output impedance sensor so as to adjust the matching parameters of the impedance match network 660. In that case, it is desirable for the output impedance sensors to see the results from a different frequency than the input impedance sensor.

In the embodiments shown in FIGS. 12 and 13, the clock signal and the index data are shared over two signal lines. In some embodiments, both the phase modulated signal and the index data are shared on the same data line.

In this detailed description, various embodiments or examples of the present invention may be implemented in numerous ways, including as a process; an apparatus; a system; a composition of matter, a computer program product embodied on a computer readable storage medium; and/or a processor, such as a hardware processor or a processor device, configured to execute instructions stored on and/or provided by a memory coupled to the processor; and/or a series of program instructions on a computer-readable medium (e.g., a computer-readable storage medium or a computer network where the program instructions are sent over optical, electronic, or wireless communication links). In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A radio frequency generator, comprising:
a radio frequency (RF) circuit comprising an RF source providing an RF signal of a first frequency derived from a first clock and a signal modulator generating a pulsed radio frequency (RF) signal having an On period where the RF signal is provided at an output terminal and an Off period where no RF signal is provided; and
an automatic level control circuit configured to sample the pulsed RF signal at the output terminal and to generate a control signal to modulate the RF signal at the radio frequency circuit, the automatic level control circuit comprising:
first and second analog-to-digital converters configured to sample respective forward RF signal and reflected RF signal at the output terminal at a sampling frequency and to generate digital samples of the respective forward and reflected RF signals, the sampling frequency being derived from a sampling clock synchronized to the first clock and being less than the first frequency of the RF signal;
a gated accumulation circuit configured to receive respective digital samples of the forward and reflected RF signals and selecting digital samples based on a sample index identifying the digital samples;
a digital signal processor configured to process the selected digital samples to generate a measured signal level value;
an error processor configured to compare the measured signal level value to a reference signal level to generate an error signal indicative of a difference thereof; and
a modulator controller configured to generate the control signal in response to the error signal and a pulse modulation signal, the pulse modulation signal indicating the On period and Off period of the pulsed RF signal, the control signal being coupled to the modulator of the radio frequency circuit to modulate the RF signal to generate the pulsed RF signal and to control a signal level of the pulsed RF signal during the On period.

2. The radio frequency generator of claim 1, wherein the sample index is related to the sampling frequency and identifies the digital samples as a first number of data points sampled within a given conversion.

3. The radio frequency generator of claim 2, where the gated accumulation circuit selects the digital samples of the forward RF signal and the reflected RF signal during the On period of the pulsed RF signal based on the sample index.

4. The radio frequency generator of claim 2, where the sample index identifies the digital samples as four data points sampled within a given conversion.

5. The radio frequency generator of claim 1, further comprising:

a digital-to-analog convert configured to convert the control signal to an analog signal and to couple the analog signal to control the signal modulator of the radio frequency circuit.

6. The radio frequency generator of claim 1, wherein the digital signal processor comprises:
a digital filter configured to process the selected digital samples and to generate a first parameter value associated with the forward RF signal and a second parameter value associated with the reflected RF signal, each of the first and second parameter values being indicative of a level value and a phase value of the respective forward or reflected RF signal measured by the selected digital samples; and
an impedance and level processor configured to process the first parameter value and the second parameter value to generate the measured signal level value.

7. The radio frequency generator of claim 1, further comprising:
a simulated attenuation processor configured to generate an estimated signal level value and to provide the estimated signal level value to the error processor during the Off period where no digital sample of the RF signal is selected by the gated accumulation circuit, the estimated signal level value being provided to the error processor as the measured signal level,
wherein the simulated attenuation processor generates the estimated signal level value based on the error signal and parameters of the radio frequency circuit.

8. The radio frequency generator of claim 1, wherein the pulsed RF signal comprises a multi-level pulsed RF signal having a first signal level during a first On period and a second signal level during a second On period, the first signal level being different from the second level.

9. The radio frequency generator of claim 8, wherein the sample index comprises a first sample index identifying the digital samples as the first number of data points and a second sample index identifying the signal level of the pulsed RF signal, the second sample index having a first logical value indicating the first signal level and a second logical value indicating the second signal level.

10. The radio frequency generator of claim 9, wherein the automatic level control circuit further comprises:
a first signal processing path for processing digital samples having the first signal level identified by the second sample index;
a second signal processing path for processing digital samples having the second signal level identified by the second sample index, wherein each of the first and second signal processing path comprises the gated accumulation circuit, the digital signal processor and the error processor, the first signal processing path generating a first error signal indicative of a difference between the first signal level and a first reference signal level and the second signal processing path generating a second error signal indicative of a difference between the second signal level and a second reference signal level; and
a data selector configured to select one of the first and second error signals and provide the selected error signal to the modulator controller, wherein the modulator controller generates the control signal in response to the selected error signal to control the signal level of the pulsed RF signal during an On period of the pulsed RF signal having a signal level associated with the selected error signal.

11. The radio frequency generator of claim 10, wherein each of the first and second signal processing path further comprises:
a simulated attenuation processor configured to generate an estimated signal level value and to provide the estimated signal level value to the error processor in each signal processing path during the Off period where no digital sample of the RF signal is selected by the gated accumulation circuit, the estimated signal level value being provided to the error processor as the measured signal level, wherein the simulated attenuation processor generates the estimated signal level value based on the respective error signal and parameters of the radio frequency circuit.

12. The radio frequency generator of claim 1, further comprising:
an index generator configured to generate the sample index in response to the pulse modulation signal and the sampling frequency.

13. The radio frequency generator of claim 1, further comprising:
first and second directional couplers coupled to the output terminal to sample the respective forward RF signal and reflected RF signal and to provide the sampled signals to the respective first and second analog-to-digital converters.

14. A method of controlling a signal level of a radio frequency (RF) signal, comprising:
generating the RF signal of a first frequency derived from a first clock;
generating a pulsed RF signal having an On period where the RF signal is provided and an Off period where no RF signal is provided;
sampling, at a sampling frequency, a forward RF signal and a reflected RF signal relating to the pulsed RF signal to generate digital samples of the forward RF signal and the reflected RF signal, the sampling frequency being derived from a sampling clock synchronized to the first clock and being less than the first frequency of the RF signal;
selecting digital samples of the forward and reflected RF signals based on a sample index identifying the digital samples;
processing the selected digital samples to generate a measured signal level value;
determining an error signal indicative of a difference between the measured signal level value and a reference signal level;
generating a control signal in response to the error signal and a pulse modulation signal, the pulse modulation signal indicating the On period and Off period of the pulsed RF signal; and
applying the control signal to modulate the RF signal to generate the pulsed RF signal and to control a signal level of the pulsed RF signal during the On period.

15. The method of claim 14, further comprising wherein the sample index is related to the sampling frequency and identifies the digital samples as a first number of data points sampled within a given conversion.

16. The method of claim 14, wherein selecting digital samples of the forward and reflected RF signals based on a sample index identifying the digital samples comprises:
selecting digital samples of the forward and reflected RF signals during the On period of the pulsed RF signal based on the sample index.

17. The method of claim 14, further comprising:
generating an estimated signal level value and providing the estimated signal level value as the measured signal level value for determining the error signal, the estimated signal level value being based on the error signal and parameters associated with generating the RF signal.

18. The method of claim 14, wherein the pulsed RF signal comprises a multi-level pulsed RF signal having a first signal level during a first On period and a second signal level during a second On period, the first signal level being different from the second level; and wherein the sample index comprises a first sample index identifying the digital samples as the first number of data points and a second sample index identifying the signal level of the pulsed RF signal, the second sample index having a first logical value indicating the first signal level and a second logical value indicating the second signal level.

19. The method of claim 18, further comprising:
processing digital samples having the first signal level identified by the second sample index;
generating a first error signal indicative of a difference between the first signal level and a first reference signal level;
processing digital samples having the second signal level identified by the second sample index;
generating a second error signal indicative of a difference between the second signal level and a second reference signal level;
selecting one of the first and second error signals as the error signal to generate the control signal; and
generating the control signal in response to the selected error signal to control the signal level of the pulsed RF signal during an On period of the pulsed RF signal having a signal level associated with the selected error signal.

20. The method of claim 14, further comprising:
generating the sample index in response to the pulse modulation signal and the sampling frequency.

* * * * *